United States Patent
Nakagawa

(10) Patent No.: US 9,865,620 B2
(45) Date of Patent: *Jan. 9, 2018

(54) SEMICONDUCTOR DEVICE HAVING SEMICONDUCTOR LAYER THAT INCLUDES CHANNEL REGION FORMED INTO CONCAVE SHAPE, ELECTRO-OPTICAL DEVICE, METHOD OF MANUFACTURING SEMICONDUCTOR DEVICE, METHOD OF MANUFACTURING ELECTRO-OPTICAL DEVICE, AND ELECTRONIC APPARATUS

(71) Applicant: Seiko Epson Corporation, Tokyo (JP)

(72) Inventor: Masashi Nakagawa, Chitose (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/363,713

(22) Filed: Nov. 29, 2016

(65) Prior Publication Data
US 2017/0077148 A1    Mar. 16, 2017

Related U.S. Application Data

(63) Continuation of application No. 15/046,156, filed on Feb. 17, 2016, now Pat. No. 9,543,327, which is a (Continued)

(30) Foreign Application Priority Data

Apr. 18, 2013  (JP) ................................ 2013-087211

(51) Int. Cl.
*H01L 29/786*   (2006.01)
*H01L 27/12*    (2006.01)
(Continued)

(52) U.S. Cl.
CPC ........ *H01L 27/1222* (2013.01); *G02F 1/1368* (2013.01); *G02F 1/133345* (2013.01);
(Continued)

(58) Field of Classification Search
CPC ............. H01L 27/1214; H01L 27/1222; H01L 29/78603; H01L 29/78621; H01L 29/78675; H01L 29/78696
See application file for complete search history.

(56) References Cited

U.S. PATENT DOCUMENTS 4,131,909 A   12/1978  Matsuda et al.
5,893,745 A    4/1999  Park
(Continued)

FOREIGN PATENT DOCUMENTS

JP   2001-085699 A    3/2001
JP   2001-318625 A   11/2001
(Continued)

OTHER PUBLICATIONS

Non-Final Office Action received in U.S. Appl. No. 14/254,427, dated May 13, 2015.
(Continued)

*Primary Examiner* — Stephen W Smoot
(74) *Attorney, Agent, or Firm* — ALG Intellectual Property, LLC

(57) ABSTRACT

A first insulation layer includes a concave portion. A semiconductor layer includes a source area and a drain area, and a channel area disposed at the concave portion of the first insulation layer. A gate insulation layer covers the channel area. A gate electrode is disposed to be opposed to the channel area via the gate insulation layer. A first electrode is one of a source electrode and a drain electrode. A second electrode is the other of the source electrode and the drain electrode.

11 Claims, 8 Drawing Sheets

Related U.S. Application Data continuation of application No. 14/254,427, filed on Apr. 16, 2014, now Pat. No. 9,299,850.

(51) Int. Cl.
*H01L 29/423* (2006.01)
*G02F 1/1333* (2006.01)
*G02F 1/1362* (2006.01)
*G02F 1/1368* (2006.01)

(52) U.S. Cl.
CPC .. *G02F 1/136227* (2013.01); *G02F 1/136286* (2013.01); *H01L 27/124* (2013.01); *H01L 27/1218* (2013.01); *H01L 27/1262* (2013.01); *H01L 29/42384* (2013.01); *H01L 29/78603* (2013.01); *H01L 29/78621* (2013.01); *H01L 29/78633* (2013.01); *H01L 29/78675* (2013.01); *H01L 29/78696* (2013.01); *G02F 2001/13685* (2013.01)

(56) References Cited

U.S. PATENT DOCUMENTS

| | | | |
|---|---|---|---|
| 6,512,246 | B1 | 1/2003 | Tanabe |
| 8,247,818 | B2 | 8/2012 | Ishii |
| 9,543,327 | B2 * | 1/2017 | Nakagawa ........ H01L 29/78675 |
| 2003/0052337 | A1 | 3/2003 | Tanabe |
| 2004/0084728 | A1 | 5/2004 | Tanabe |
| 2008/0057649 | A1 | 3/2008 | Schuele et al. |
| 2008/0246088 | A1 | 10/2008 | Schuele et al. |

FOREIGN PATENT DOCUMENTS

| | | |
|---|---|---|
| JP | 2002-244155 A | 8/2002 |
| JP | 2008-060524 A | 3/2008 |
| JP | 2009-122253 A | 6/2009 |
| JP | 2011-221072 A | 11/2011 |

OTHER PUBLICATIONS

Final Office Action received in U.S. Appl. No. 14/254,427, dated Sep. 4, 2015.
Notice of Allowance and Notice of Allowability received in U.S. Appl. No. 14/254,427, dated Nov. 25, 2015.
Non-Final Office Action received in U.S. Appl. No. 15/046,156, dated May 18, 2016.
Notice of Allowance and Notice of Allowability received in U.S. Appl. No. 15/046,156, dated Aug. 30, 2016.

\* cited by examiner

SEMICONDUCTOR DEVICE HAVING SEMICONDUCTOR LAYER THAT INCLUDES CHANNEL REGION FORMED INTO CONCAVE SHAPE, ELECTRO-OPTICAL DEVICE, METHOD OF MANUFACTURING SEMICONDUCTOR DEVICE, METHOD OF MANUFACTURING ELECTRO-OPTICAL DEVICE, AND ELECTRONIC APPARATUS

The present application is a continuation application of U.S. patent application Ser. No. 15/046,156 filed Feb. 17, 2016 (now U.S. Pat. No. 9,543,327), which claims priority from U.S. patent application Ser. No. 14/254,427 filed Apr. 16, 2014 (now U.S. Pat. No. 9,299,850), which claims priority from Japanese Patent Application No. 2013-087211 filed Apr. 18, 2013, which are hereby expressly incorporated by reference in their entirety.

BACKGROUND

1. Technical Field

The present invention relates to a semiconductor device, an electro-optical device, a method of manufacturing the semiconductor device, and a method of manufacturing the electro-optical device, an electronic apparatus, and the like.

2. Related Art

For example, as one electro-optical device, a liquid crystal device of an active driving method, which includes a transistor (semiconductor device) that is an element for switching pixel electrodes and is included in each pixel, is known. The liquid crystal device is used for, for example, a direct-view display, a light valve of a projector, or the like.

In general, the transistor is formed such that a semiconductor layer is approximately parallel to a surface of a substrate. It is necessary for an area where the transistor is formed to be in a light-blocking area, and if the area is wide, an aperture ratio decreases. Thus, for a purpose of further improving the aperture ratio, in a method described in, for example, JP-A-2011-221072, the semiconductor layer is arranged in a direction which is approximately perpendicular to the surface of the substrate, and thereby it is possible to decrease the area of the transistor in a plan view, and to decrease the light-blocking area.

However, in the method described in the above-described JP-A-2011-221072, there is a problem that it is difficult to implement a method for forming a source-drain area on the semiconductor layer. In other words, since it is difficult to implement a method for injecting ions into the semiconductor layer, a simple manufacturing method is required.

SUMMARY

The invention can be realized in the following forms or application examples.

Application Example 1

According to this application example, there is provided a semiconductor device including: a semiconductor layer which includes one of a source area and a drain area, the other of the source area and the drain area, and a channel area; a gate insulation layer which covers the channel area; a gate electrode which is arranged so as to be opposed to the channel area via the gate insulation layer; a first electrode which is one of a source electrode and a drain electrode; and a second electrode which is the other of the source electrode and the drain electrode, in which the one of the source area and the drain area is arranged so as to cover a first surface of a first insulation layer, in which the other of the source area and the drain area is arranged so as to cover a second surface of the first insulation layer, in which the channel area is arranged so as to cover a third surface of the first insulation layer, in which the first insulation layer includes a fourth surface between the first surface and the third surface, and a fifth surface between the second surface and the third surface, and in which there is a gap between the first surface and the third surface.

In this case, the concave portion configured by the third surface, the fourth surface, and the fifth surface in the first insulation layer, is provided. Also, the semiconductor layer, the gate insulation layer, and the gate electrode are formed along at least the third surface which is a bottom surface of the concave portion, and the fourth surface and the fifth surface which are side surfaces of the concave portion. Thus, it is possible to decrease a width of the gate electrode in a plan view, without reducing a gate length. As a result, it is possible to decrease a light-blocking area, and to improve an aperture ratio. In addition, it is possible to inject ions into the semiconductor layer by use of a manufacturing method of the related art, and thereby a transistor can be relatively simply formed.

Application Example 2

In the semiconductor device according to the application example, the first insulation layer includes a sixth surface which opposes the first surface, a seventh surface which opposes the second surface, an eighth surface which opposes the third surface, a ninth surface which opposes the fourth surface, and a tenth surface which opposes the fifth surface.

In this case, the concave portion configured by the third surface, the fourth surface, and the fifth surface in the first insulation layer, is provided. Also, the semiconductor layer, the gate insulation layer, and the gate electrode are formed along at least the third surface which is the bottom surface of the concave portion, and the fourth surface and the fifth surface which are side surfaces of the concave portion. Thus, it is possible to decrease a width of the gate electrode, as viewed from a direction towards the back surface from the first surface and the second surface (in a plan view), without reducing a gate length. As a result, it is possible to decrease a light-blocking area, and to improve the aperture ratio. In addition, it is possible to inject ions into the semiconductor layer by use of a manufacturing method of the related art, and thereby a transistor can be relatively simply formed.

In addition, the first insulation layer includes a sixth surface which opposes the first surface, a seventh surface which opposes the second surface, an eighth surface which opposes the third surface, a ninth surface which opposes the fourth surface, and a tenth surface which opposes the fifth surface. It is possible for the scan line to be arranged so as to contact the sixth surface to the tenth surface, and light-blocking of the semiconductor device can be performed by the scan line. In addition, since the gate electrode and the scan line (back gate) are arranged so as to be opposed to the semiconductor layer, it is possible to function as double gate electrodes. As a result, it is possible to improve ON and OFF characteristics of the transistor.

Application Example 3

In the semiconductor device according to the application example, the first electrode is arranged at an internal portion of a first contact hole which is arranged so as to penetrate a second insulation layer which covers the semiconductor layer and the gate electrode, and the gate insulation layer. Also, the second electrode is arranged at an internal portion of a second contact hole which is arranged so as to penetrate the second insulation layer and the gate insulation layer.

In this case, the first electrode and the second electrode which are connected to one of the source area and the drain area, or the other of the source area and the drain area, are formed so as to penetrate the second insulation layer and the gate insulation layer, and thereby it is possible to inject the ions into the semiconductor layer by use of the manufacturing method of the related art, and to relatively simply draw the first electrode and the second electrode to an upper layer.

Application Example 4

According to this application example, there is provided an electro-optical device including: a substrate; a plurality of scan lines; and a plurality of data lines which are arranged so as to intersect each of the plurality of scan lines, in which the semiconductor device is electrically connected to any one of the plurality of scan lines and any one of the plurality of data lines, in which the substrate includes an eleventh surface which opposes the sixth surface, a twelfth surface which opposes the seventh surface, a thirteenth surface which opposes the eighth surface, a fourteenth surface which opposes the ninth surface, and a fifteenth surface which opposes the tenth surface, and in which the scan line is arranged between the substrate and the semiconductor device.

In this case, the concave portion configured by the thirteenth surface, the fourteenth surface, and the fifteenth surface in the substrate, is provided. Also, the semiconductor layer, the gate insulation layer, and the gate electrode are formed along at least the thirteenth surface which is the bottom surface of the concave portion, and the fourteenth surface and the fifteenth surface which are side surfaces of the concave portion. Thus, it is possible to decrease the width of the gate electrode in a plan view, without reducing the gate length. As a result, it is possible to decrease the light-blocking area, and to improve the aperture ratio. In addition, it is possible to inject the ions into the semiconductor layer by use of the manufacturing method of the related art, and thereby a transistor can be relatively simply formed.

Application Example 5

According to this application example, there is provided an electro-optical device including: the semiconductor device according to the application examples; a pixel electrode which is electrically connected to the semiconductor device; an element substrate which includes the semiconductor device and the pixel electrode; an opposing substrate which is arranged so as to be opposed to the element substrate; and an electro-optical layer which is interposed between the element substrate and the opposing substrate.

In this case, since a magnitude of the semiconductor device in a plan view is suppressed, it is possible to improve the aperture ratio.

Application Example 6

In the electro-optical device according to the application example, a direction from one of a source area and a drain area towards the other of the source area and the drain area is set along a direction in which a scan line is extended.

In this case, the transistor is arranged in a direction parallel to the scan line, that is, a direction orthogonal to a source line (data line). Thus, it is possible to arrange the source line directly on the transistor without interfering with the other of the source area and the drain area.

Application Example 7

According to this application example, there is provided a method of manufacturing a semiconductor device including: forming a first insulation layer which includes a fourth surface between a first surface and a third surface, a fifth surface between the second surface and the third surface, and a gap between the first surface and the third surface; forming a semiconductor layer so as to cover the first insulation film; forming a gate insulation layer so as to cover the semiconductor layer; forming a gate electrode so as to cover the gate insulation layer and at least a portion of the semiconductor layer which covers the third surface; forming one of a source area and a drain area in at least a portion of the semiconductor layer which is arranged so as to cover the first surface, after ions are injected into the semiconductor layer, and forming the other of the source area and the drain area in at least a portion of the semiconductor layer which is arranged so as to cover the third surface; and forming a first electrode which is electrically connected to one of the source area and the drain area, and a second electrode which is electrically connected to the other of the source area and the drain area.

In this case, the concave portion configured by the third surface, the fourth surface, and the fifth surface in the first insulation layer, is provided. Also, the semiconductor layer, the gate insulation layer, and the gate electrode are formed along at least the third surface which is the bottom surface of the concave portion, and the fourth surface and the fifth surface which are side surfaces of the concave portion. Thus, it is possible to decrease the width of the gate electrode in a plan view, without reducing the gate length. As a result, it is possible to decrease the light-blocking area, and to improve the aperture ratio. In addition, it is possible to inject ions into the semiconductor layer by use of the manufacturing method of the related art, and thereby the transistor can be relatively simply formed.

Application Example 8

According to this application example, there is provided a method of manufacturing an electro-optical device including: electrically connecting the semiconductor device via the contact hole to a pixel electrode; and forming an electro-optical layer on the pixel electrode.

In this case, since the magnitude of the semiconductor device in a plan view is suppressed, it is possible to improve the aperture ratio.

Application Example 9

According to this application example, there is provided an electronic apparatus including: the electro-optical device according to the application examples.

In this case, since the above-described electro-optical device is included, it is possible to provide an electronic apparatus with a high display quality.

BRIEF DESCRIPTION OF THE DRAWINGS

The present invention will be described with reference to the accompanying drawings, wherein like numbers reference like elements.

DESCRIPTION OF EXEMPLARY EMBODIMENTS

Hereinafter, embodiments in which the present invention is specified will be described with reference to the drawings. In addition, the drawings which are used are illustrated to be enlarged or reduced appropriately such that the description thereof can be recognized.

In addition, in the following embodiments, for example, when described as "on a (the) substrate", it means that a configuration member is arranged so as to contact an upper surface of the substrate, or arranged via another configuration element on the substrate, or arranged so as to contact a portion of the substrate and arranged via the another configuration element on another portion of the substrate.

In the present embodiment, as a liquid crystal device, an active matrix type liquid crystal device which includes a thin film transistor (TFT) as a switching element of a pixel will be described as an example. The liquid crystal device can be suitably used as a light modulation element (liquid crystal light valve) of a projection type display device (liquid crystal projector), for example.

Configuration of Liquid Crystal Device Used as Electro-Optical Device

Figure 1:
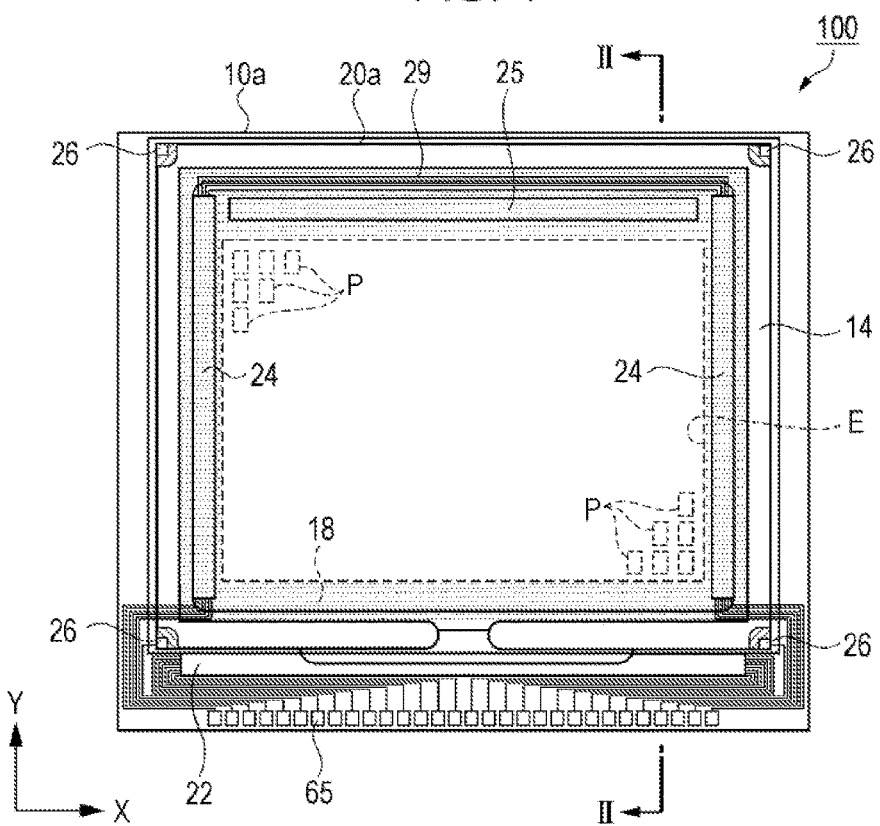
FIG. 1 is a schematic plan view illustrating a configuration of a liquid crystal device which is an electro-optical device according to a first embodiment.
Figure 2:
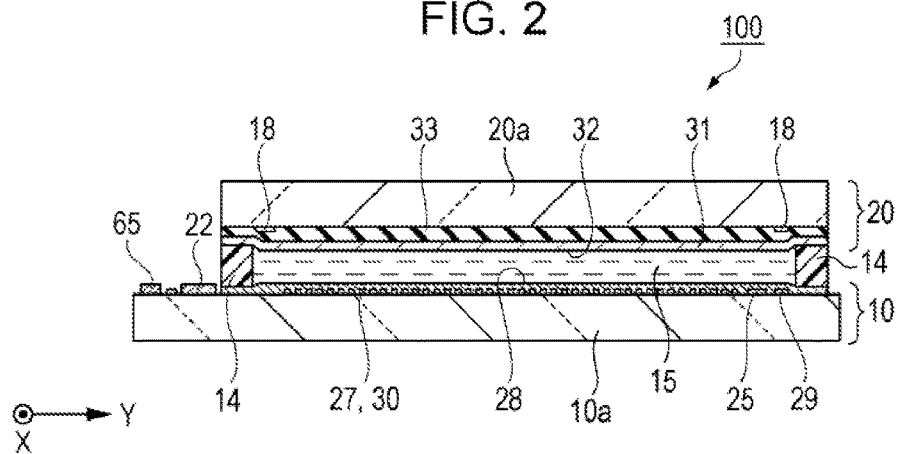
FIG. 2 is a schematic cross-sectional view taken along a II-II line of the liquid crystal device illustrated in FIG. 1.
Figure 3:
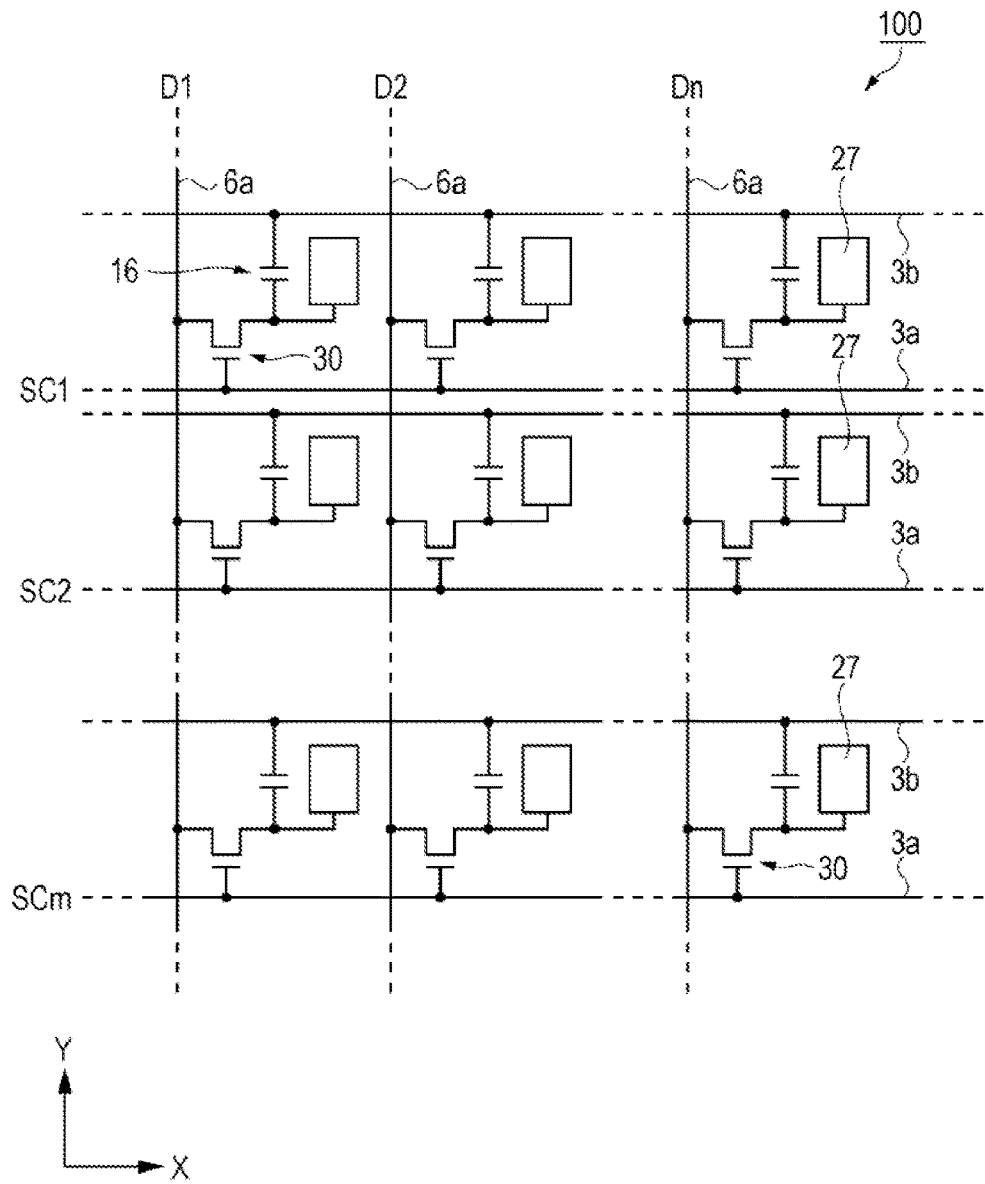
FIG. 3 is an equivalent circuit diagram illustrating an electrical configuration of a liquid crystal device.

FIG. 1 is a schematic plan view illustrating a configuration of the liquid crystal device used as an electro-optical device. FIG. 2 is a schematic cross-sectional view taken along a II-II line of the liquid crystal device illustrated in FIG. 1. FIG. 3 is an equivalent circuit diagram illustrating an electrical configuration of a liquid crystal device. Hereinafter, the configuration of the liquid crystal device will be described with reference to FIGS. 1 to 3.

As illustrated in FIGS. 1 and 2, the liquid crystal device 100 according to the present embodiment includes an element substrate 10 and an opposing substrate 20 which are arranged against each other, and a liquid crystal layer 15 used as an electro-optical layer interposed between such a pair of substrates. A first base member 10a used as a substrate which configures the element substrate 10, and a second base member 20a which configures the opposing substrate 20 use a transparent substrate such as a glass substrate or a quartz substrate.

The element substrate 10 is larger than the opposing substrate 20, and both substrates are bonded by a seal material 14 arranged along a periphery of the opposing substrate 20. At an internal side of the seal material 14 formed in a circle in a plan view, the liquid crystal layer 15 is formed by filling a liquid crystal with positive or negative dielectric anisotropy between the element substrate 10 and the opposing substrate 20. The seal material 14 employs a glue such as epoxy resin with a thermal curing property or an ultraviolet curing property, for example. Spacers (not illustrated) for maintaining a constant interval between a pair of substrates are mixed in the seal material 14.

A display area E in which a plurality of pixels P is arranged is formed inside an internal edge of the seal material 14. In addition to the plurality of pixels P which contribute to the display, the display area E may include dummy pixels which are arranged so as to surround the plurality of pixels P. In addition, although not illustrated in FIGS. 1 and 2, a light-blocking film (block matrix; BM) which respectively separates the plurality of pixels P in the display area E in a plan view is formed in the opposing substrate 20.

A data line driving circuit 22 is formed between the seal material 14 along a side portion of the element substrate 10 and one side portion of the element substrate 10. In addition, a test circuit 25 is formed between the seal material 14 along another side portion opposing the one side portion and the display area E. Further, scan line driving circuits 24 are formed between the seal material 14 along two other side portions which are orthogonal to the one side portion and oppose each other and the display area E. A plurality of interconnects 29 which connect the two scan line driving circuit 24 to each other is formed between the seal material 14 along another side portion opposing the one side portion and the test circuit 25.

A light-blocking film 18 (separation portion) is formed between the seal material 14 arranged in a circle in opposing substrate 20 and the display area E. The light-blocking film 18 is configured with, for example, a metal with a light-blocking property, a metal oxide or the like, and an internal side of the light-blocking film 18 is formed by the display area E where there is the plurality of pixels P. In addition, although not illustrated in FIG. 1, another light-blocking film which separates the plurality of pixels P in a plan view is also formed in the display area E.

The interconnects which are connected to the data line driving circuit 22 and the scan line driving circuit 24 are connected to a plurality of external connection terminals 65 which are arranged along the one side portion. Hereinafter, a direction along the one side portion is referred to as an X direction, and a direction along the two other side portions which are orthogonal to the one side portion and oppose to each other is referred to as a Y direction.

As illustrated in FIG. 2, on a surface of the first base member 10a on the liquid crystal layer 15 side, a plurality of pixel electrodes 27 with a light-transmitting property and a plurality of thin film transistors (TFT, hereinafter referred to as TFT 30), namely, switching elements, which are formed in each pixel P, signal interconnects, and an alignment film 28 which covers these things are formed.

In addition, a light-blocking structure by which a switching operation is prevented from becoming unstable when light is incident on a semiconductor layer (activation layer) in the TFT 30, is employed. The element substrate 10 according to the invention includes at least the pixel electrodes 27, the TFT 30, and the alignment film 28.

On a surface of the opposing substrate 20 on the liquid crystal layer 15 side, the light-blocking film 18, a planarizing layer 33 which is formed so as to cover the light-blocking film 18, an opposing electrode 31 which is formed so as to cover the planarizing layer 33, and an alignment film 32 which covers the opposing electrode 31, are formed. The opposing substrate 20 according to the invention includes at least the opposing electrode 31 and the alignment film 32.

As illustrated in FIG. 1, the light-blocking film 18 surrounds the display area E and is formed at a position which overlaps the scan line driving circuit 24 and the test circuit 25 (simply illustrated) in a plan view. As a result, light which is incident on a peripheral circuit including a driving circuit thereof from the opposing substrate 20 side, is blocked, and the peripheral circuit is prevented from malfunctioning due to light. In addition, unnecessary stray light is blocked so as not to be incident on the display area E, and high contrast is secured in the display of the display area E.

The planarizing layer 33 is formed of inorganic materials such as silicon oxide, has the light-transmitting property, and is formed so as to cover the light-blocking film 18. As a method of forming such a planarizing layer 33, a method of forming a film using, for example, a plasma chemical vapor deposition (CVD) method or the like can be used.

The opposing electrode 31 is formed of a transparent conductivity film such as indium tin oxide (ITO), covers the planarizing layer 33, and is electrically connected to an interconnect on the element substrate 10 side by upper and lower conductive portions 26 which are formed at the four corners of the opposing substrate 20, as illustrated in FIG. 1.

The alignment film 28 which covers the pixel electrodes 27 and the alignment film 32 which covers the opposing electrodes 31 are selected based on an optical design of the liquid crystal device 100. For example, inorganic materials such as SiOx (silicon oxide) are formed using a vapor growth method, and an inorganic alignment film which is approximately perpendicular aligned with respect to liquid crystal molecular with negative dielectric anisotropy can be used.

Such a liquid crystal device 100 is a transmission type, and employs an optical design of a normally white mode in which a transmittance of the pixel P at the time of a voltage not being applied is greater than a transmittance of the pixel P at the time of a voltage being applied, or an optical design of a normally black mode in which the transmittance of the pixel P at the time of the voltage not being applied is less than the transmittance of the pixel P at the time of the voltage being applied. Polarizing elements are respectively arranged so as to be used on an incident side and an exit side of the light according to the optical design.

As illustrated in FIG. 3, the liquid crystal device 100 includes a plurality of scan lines 3a and a plurality of data lines 6a which are insulated and orthogonal to each other in at least the display area E, and capacitance lines 3b used as common potential lines. A direction in which the scan lines 3a extend is the X direction, and a direction in which the data lines 6a is the Y direction.

The pixel electrodes 27, the TFT 30, and storage capacitors 16 are formed in areas which are separated by the scan lines 3a, the data lines 6a, the capacitance lines 3b, and a sort of signal lines of such lines, and all of these configure a pixel circuit of the pixels P.

The scan line 3a is electrically connected to a gate of the TFT 30, and the data line 6a is electrically connected to a source-drain area (source area: one of a source area and a drain area) on a data line side of the TFT 30. The pixel electrode 27 is electrically connected to a source-drain area (drain area: the other of the source area and the drain area) on a pixel electrode side of the TFT 30.

The data lines 6a are connected to the data line driving circuit 22 (refer to FIG. 1), and to supply pixel signals D1, D2, . . . , Dn received from the data line driving circuit 22 to the pixels P. The scan lines 3a are connected to the scan line driving circuit 24 (refer to FIG. 1), and supply scan signals SC1, SC2, . . . , SCm received from the scan line driving circuit 24 to the pixels P.

Image signals D1 to Dn which are supplied from the data line driving circuit 22 to the data lines 6a may also be sequentially supplied in this order, and may also be supplied to each group with respect to groups of a plurality of data lines 6a adjacent to each other. The scan line driving circuit 24 supplies the scan lines 3a with scan signals SC1 to SCm at a predetermined timing.

The liquid crystal device 100 is configured such that the image signals D1 to Dn supplied from the data lines 6a are written to the pixel electrodes 27 at the predetermined timing, for each time when the TFT 30 which is a switching element is ON for a predetermined time by the input scan signals SC1 to SCm. Then, the image signals D1 to Dn with predetermined levels which are written to the liquid crystal layer 15 via the pixel electrode 27 are retained for a predetermined time between the pixel electrode 27 and the opposing electrode 31 arranged so as to be opposed to the pixel electrode 27 via the liquid crystal layer 15.

In order to prevent the retained image signals D1 to Dn from being leaked, the storage capacitors 16 are connected in parallel with liquid crystal capacitors formed between the pixel electrode 27 and the opposing electrode 31. The storage capacitor 16 is formed between the source-drain area on a pixel electrode side of the TFT 30 and the capacitance line 3b.

Configurations of Liquid Crystal Device and Semiconductor Device

Figure 4:
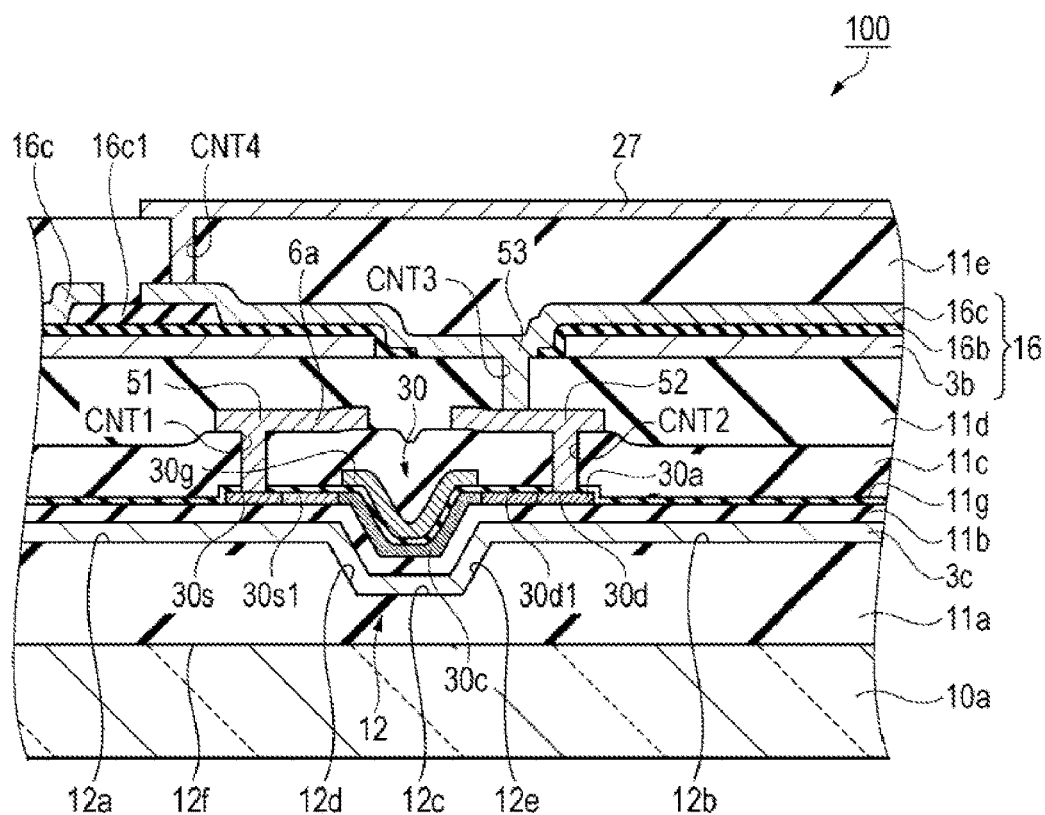
FIG. 4 is a schematic cross-sectional view illustrating a structure of a liquid crystal device and a semiconductor device.
Figure 5:
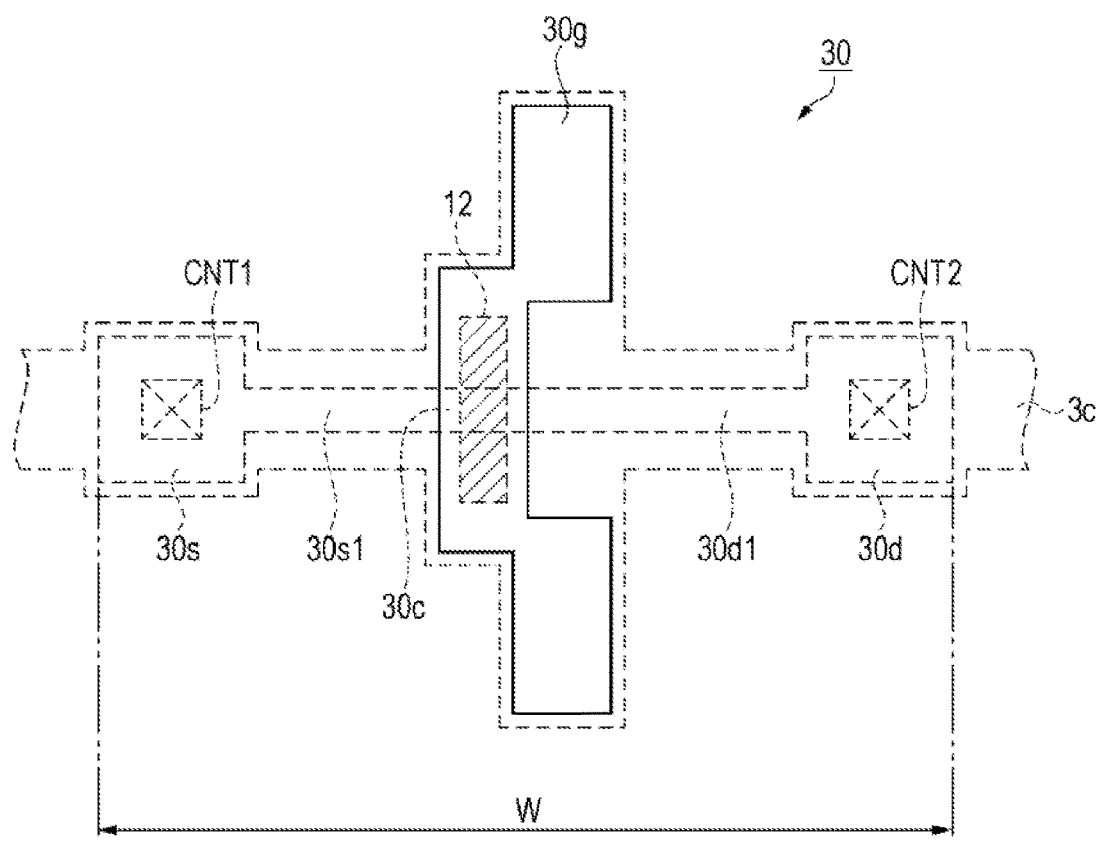
FIG. 5 is a schematic plan view from above the semiconductor device in the liquid crystal device illustrated in FIG. 4.

FIG. 4 is a schematic cross-sectional view illustrating a structure of a TFT used as the liquid crystal device and the semiconductor device. FIG. 5 is a schematic plan view from above the semiconductor device in the liquid crystal device illustrated in FIG. 4. Hereinafter, the structure of the liquid crystal device and the semiconductor device will be described with reference to FIGS. 4 and 5. In addition, FIGS. 4 and 5 illustrate a cross-sectional positional relationship of each configuration element, and are represented by a specific measure.

As illustrated in FIG. 4, the liquid crystal device 100 includes the element substrate 10 which is one substrate between a pair of substrates, and the opposing substrate 20 (not illustrated) which is the other substrate and arranged so as to be opposed to the element substrate. The first base member 10a which configures the element substrate 10, as described above, is configured by a quartz substrate or the like, for example.

A lower insulation layer 11a (lower layer insulation layer) formed of a silicon oxide film or the like is formed on the first base member 10a. A concave portion 12 which is formed by a portion of an area, in which the TFT 30 is formed, protruded towards the first base member 10a side, is formed in the lower insulation layer 11a. Specifically, upper surfaces of areas except for the concave portion 12 in the lower insulation layer 11a are referred to as a first surface 12a (sixth surface and eleventh surface) and a second surface 12b (seventh surface and twelfth surface), respectively. In addition, a bottom surface of the concave portion 12 is referred to as a third surface 12c (eighth surface and thirteenth surface). A slope surface (side surface) between the first surface 12a and the third surface 12c is referred to as a fourth surface 12d (ninth surface and fourteenth surface). Further, a slope surface (side surface) between the second surface 12b and the third surface 12c is referred to as a fifth surface 12e (tenth surface and fifteenth surface). That is, a concave portion 12 in which a distance between a back surface 12f and the third surface 12c is shorter than a distance between the back surface 12f and the first and second surfaces 12a and 12b, is formed.

As illustrated in FIGS. 4 and 5, a lower light-blocking film 3c which includes materials such as Al (aluminum), Ti (titanium), Cr (chromium), and W (tungsten) is formed on the lower insulation layer 11a. The lower light-blocking film 3c is patterned in a lattice shape in a plan view, and defines an opening area of each pixel P. In addition, the lower light-blocking film 3c may have conductivity, and may function as a portion of the scan line 3a.

A first interlayer insulation layer 11b (first insulation layer) formed of silicon oxide film or the like is formed on the lower light-blocking film (scan line) 3c. The TFT 30 used as the semiconductor device is formed on the first interlayer insulation layer 11b. For example, in the TFT 30, a semiconductor layer 30a formed of polysilicon (polycrystalline silicon with high purity) or the like is formed over a surface of the first interlayer insulation layer 11b corresponding to the third surface 12c (eighth surface and thirteenth surface), the fourth surface 12d (ninth surface and fourteenth surface), and the fifth surface 12e (tenth surface and fifteenth surface) of the lower insulation layer 11a.

The TFT 30 includes a gate insulation layer 11g formed on the semiconductor layer 30a, and a gate electrode 30g formed of polysilicon film or the like which is formed so as to be opposed to the third surface 12c (eighth surface and thirteenth surface), the fourth surface 12d (ninth surface and fourteenth surface), and the fifth surface 12e (tenth surface and fifteenth surface) which are on the gate insulation layer 11g.

For example, the semiconductor layer 30a is formed as an N type TFT 30 by N type impurity ions such as inserted phosphorus (P) ions. Specifically, the semiconductor layer 30a includes a channel area 30c, a lightly doped drain (LDD) area 30s1 on a data line side, a source-drain area 30s on the data line side, an LDD area 30d1 on a pixel electrode side, and a source-drain area 30d on the pixel electrode side, for example.

P type impurity ions such as boron (B) ions are doped in the channel area 30c. N type impurity ions such as phosphorus (P) ions are doped in other areas thereof (30s, 30s1, 30d, and 30d1). In this way, the TFT 30 is formed as the N type TFT.

For example, in the semiconductor layer 30a, the source-drain area (source area) 30s on the data line side and the LDD area 30s1 on the data line side are arranged at a position corresponding to the first surface 12a in the first interlayer insulation layer 11b, the LDD area 30d1 on the pixel electrode side and the source-drain area 30d on the pixel electrode side are arranged at a position corresponding to the second surface 12b, and the channel area 30c is arranged at a position corresponding to the third surface 12c, the fourth surface 12d, and the fifth surface 12e.

In this way, since the semiconductor layer 30a, the gate insulation layer 11g, and the gate electrode 30g are formed along at least the third surface 12c, the fourth surface 12d, and the fifth surface 12e of the concave portion 12, it is possible to narrow a width (width W of the semiconductor layer 30a) of the gate electrode 30g, as viewed from a direction towards the back surface 12f from the first surface 12a and the second surface 12b (in a plan view), without shortening the gate length. As a result, it is possible to decrease the light-blocking area of the TFT 30, and to improve an aperture ratio.

A second interlayer insulation layer 11c (second insulation layer) formed of the silicon oxide film or the like is formed on the gate electrode 30g and the gate insulation layer 11g. A conduction film is formed on the second interlayer insulation layer 11c using conduction materials with the light-blocking property, such as Al (aluminum), and by patterning the conduction film, a relay electrode 51 (first electrode) connected to the source-drain area 30s on the data line side via a contact hole CNT1, and the data line 6a are formed. At the same time, a relay electrode 52 (second electrode) which is connected to the source-drain area 30d on the pixel electrode side via a contact hole CNT2 is formed.

Next, a third interlayer insulation layer 11d is formed so as to cover the data line 6a, the relay electrodes 51 and 52, and the second interlayer insulation layer 11c. For example, the third interlayer insulation layer 11d is formed of silicon oxide or silicon nitride, and a planarizing process of planarizing surface roughness caused by covering the area in which the TFT 30 is formed, is performed. As a method of the planarizing process, for example, a chemical mechanical polishing process (CMP process) or a spin coat process or the like is used. Thereafter, a contact hole CNT 3 which penetrates the third interlayer insulation layer 11d is formed.

The capacitance line 3b (COM potential) which configures a portion of the storage capacitor 16 is formed on the third interlayer insulation layer 11d. For example, the capacitance line 3b has a lamination structure in which an aluminum (Al) film is arranged in a lower layer, and a titanium nitride (TiN) film is arranged in an upper layer.

A capacitance insulation film 16b which is formed of alumina, silicon nitride film or the like is formed on the capacitance line 3b so as to cover the capacitance line 3b. In addition, a stopper film 16c1 which is formed of silicon oxide film or the like is formed near an area which is overlapped with the contact hole CNT4 area in a plan view, on the capacitance insulation film 16b. The stopper film 16c1 may be formed before the capacitance insulation film 16b is formed, that is, between the capacitance line 3b and the capacitance insulation film 16b.

On the stopper film 16c1, the capacitance insulation film 16b, and the third interlayer insulation layer 11d, the contact hole CNT3 is filled, and then a conduction film is formed using the conduction materials with the light-blocking property, such as Al (aluminum), so as to cover the third interlayer insulation layer 11d, and by patterning the conduction film, the capacitance electrode 16c used as a pixel electrode potential layer which configures the relay electrode 53 and the storage capacitor 16 which are connected to the source-drain area 30d on the pixel electrode side via the contact hole CNT3, is formed. In addition, the capacitance electrode 16c and the capacitance electrode 16c which are adjacent to each other are patterned so as to be separated on the above-described stopper film 16c1.

A fourth interlayer insulation layer 11e which is formed of silicon oxide film or the like is formed on the capacitance electrode 16c. Then, a contact hole CNT4 which penetrates the fourth interlayer insulation layer 11e is formed. The planarizing process may be performed with respect to an upper surface of the fourth interlayer insulation layer 11e in the same manner as in the third interlayer insulation layer 11d.

For example, the contact hole CNT4 which penetrates the fourth interlayer insulation layer 11e is formed at a position which is overlapped with the stopper film 16c1 in the capacitance electrode 16c in a plan view. A transparent conductivity film such as ITO is formed on the fourth interlayer insulation layer 11e so as to fill the contact hole CNT4. Then, by patterning the transparent conductivity film, the pixel electrode 27 which is connected via the contact hole CNT4 to the capacitance electrode 16c is formed.

The capacitance electrode 16c is electrically connected via the relay electrode 53, the contact hole CNT 3, the relay electrode 52, and the contact hole CNT2 to the source-drain area 30d on the pixel electrode side of the TFT 30, and electrically connected via the contact hole CNT4 to the pixel electrode 27.

The alignment film 28 (refer to FIG. 2) which is formed by obliquely depositing inorganic materials such as silicon oxide ($SiO_2$) is formed on the pixel electrode 27 and the fourth interlayer insulation layer 11e. The liquid crystal layer 15 in which liquid crystal or the like is filled in a space surrounded by the seal material 14 (refer to FIGS. 1 and 2) is formed on the alignment film 28.

Meanwhile, the opposing electrode 31 is formed on the entire surface of the second base member 20a (liquid crystal layer 15 side) (refer to FIG. 2). The alignment film 32 on which inorganic materials such as silicon oxide ($SiO_2$) are obliquely deposited is formed on the opposing electrode 31. The opposing electrode 31 is formed of a transparent conductivity film such as ITO film, in the same manner as that of the above-described pixel electrode 27.

The liquid crystal layer 15 enters a predetermined alignment state by the alignment films 28 and 32 in a state where an electric field is not generated between the pixel electrode 27 and the opposing electrode 31. The seal material 14 is a glue, which is formed of, for example, photo-curable resin or thermal curing resin, for bonding together a periphery of the element substrate 10 and a periphery of the opposing substrate 20, and a spacer such as glass fiber or glass beads for setting a distance between both substrates as a predetermined value are mixed with the seal material 14. Hereinafter, a method of manufacturing the liquid crystal device 100 will be described.

Method of Manufacturing Liquid Crystal Device and Semiconductor Device

Figure 6:
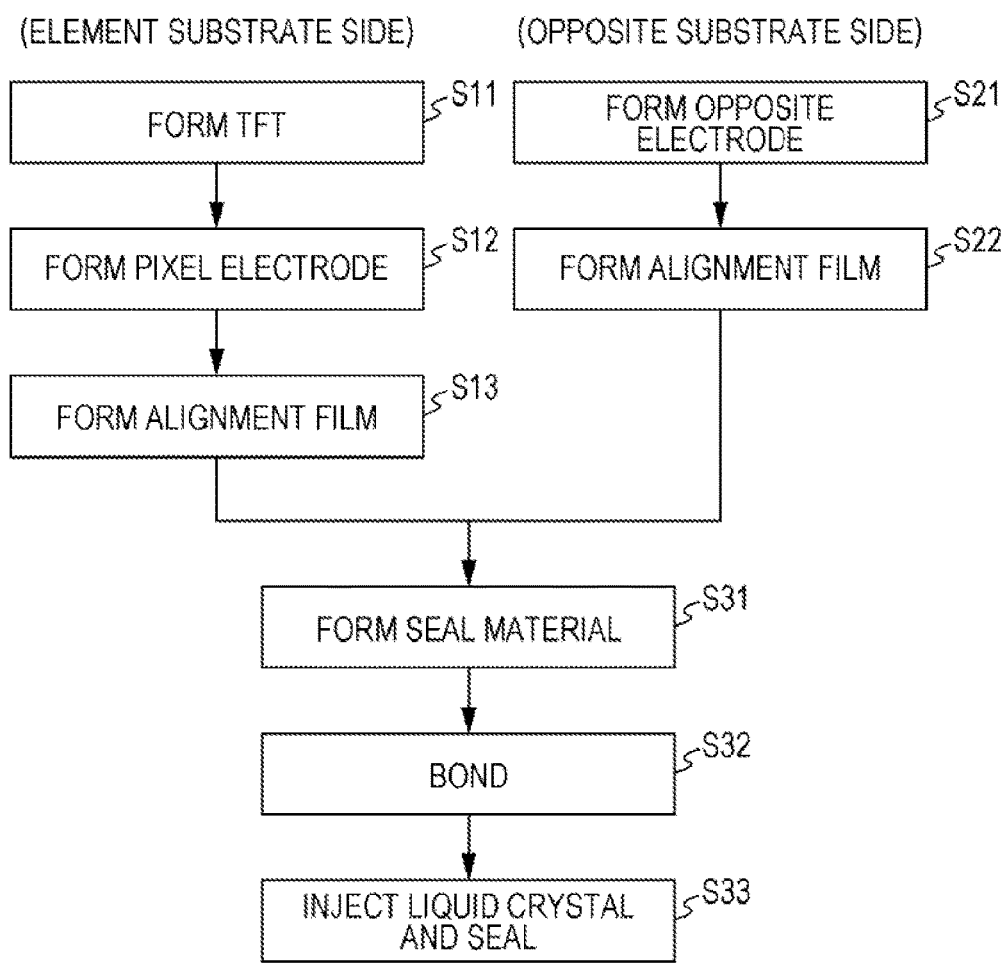
FIG. 6 is a flow chart illustrating sequential steps of a method of manufacturing a liquid crystal device.

FIG. 6 is a flow chart illustrating sequential steps of a method of manufacturing a liquid crystal device. FIGS. 7A to 7D and FIGS. 8A to 8C are schematic cross-sectional views illustrating a method of manufacturing a semiconductor device in a method of manufacturing a liquid crystal device. Hereinafter, the method of manufacturing the liquid crystal device and a method of manufacturing the semiconductor device will be described with reference to FIGS. 6 to 8C.

Figure 7A:
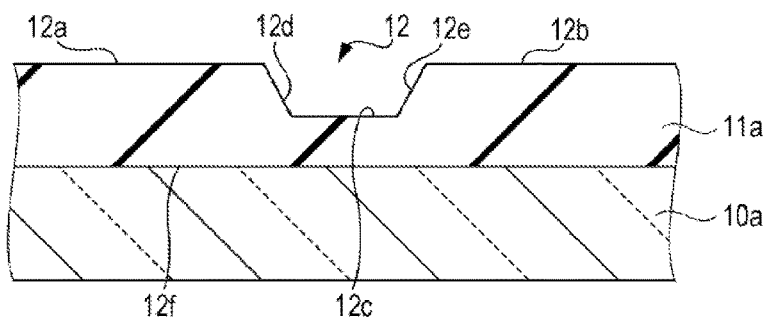
FIGS. 7A to 7D are schematic cross-sectional views illustrating a method of manufacturing a semiconductor device in a method of manufacturing a liquid crystal device.

At an initial time, a method of manufacturing an element substrate 10 side will be described. In step S11, the TFT 30 which is the semiconductor device is first formed on the first base member 10a which is formed of the quartz substrate or the like. Specifically, as illustrated in FIG. 7A, the lower insulation layer 11a formed of the silicon oxide film or the like is formed on the first base member 10a by use of the film forming technology of the related art. Next, the concave portion 12 is formed at the area in which the TFT 30 is formed by use of a photolithography technology and an etching technology (concave portion forming step). In addition, the method of forming the concave portion 12 in the lower insulation layer 11a is not limited to using the photolithography technology and the etching technology, and may be laminated (formed) such that the concave portion 12 is formed using a mask. In addition, the concave portion 12 may be formed by use of a transfer method or a physical method.

Specifically, the concave portion 12 in which a surface on the first base member 10a side in the lower insulation layer 11a is termed a back surface 12f, a surface opposing the back surface 12f is termed a first surface 12a (eleventh surface) and a second surface 12b (twelfth surface), a bottom surface of the concave portion 12 is termed a third surface 12c (thirteenth surface), a slope surface between the first surface 12a and the third surface 12c is termed a fourth surface (fourteenth surface), and a slope surface between the second surface and the third surface 12c is termed a fifth surface 12e (fifteenth surface), is formed. That is, a distance between the back surface 12f and the third surface 12c is shorter than a distance between the back surface 12f and the first surface 12a or the second surface 12b.

Figure 7B:
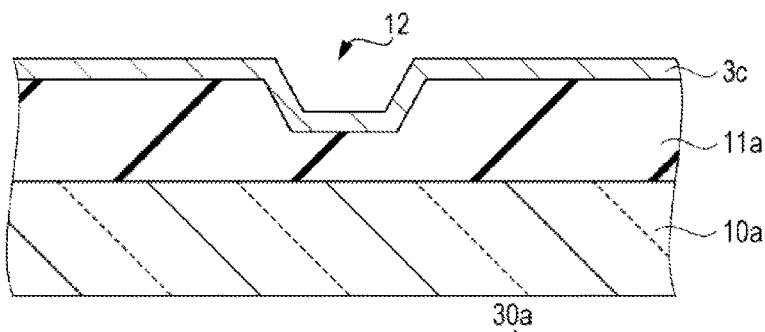

In a step illustrated in FIG. 7B, the lower light-blocking film 3c which is formed of the aluminum or the like is formed on the lower insulation layer 11a. In addition, the lower light-blocking film 3c is formed according to contours of the lower insulation layer 11a in a lower layer. A thickness of the lower light-blocking film 3c is, for example, 0.2 μm.

Figure 7C:
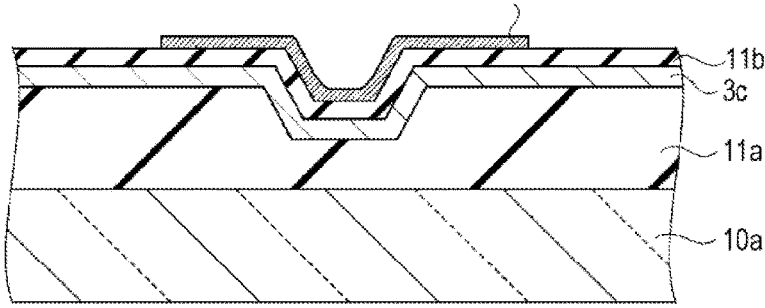

In a step (first insulation layer forming step and semiconductor layer forming step) illustrated in FIG. 7C, the first interlayer insulation layer 11b and semiconductor layer 30a are formed. Specifically, the first interlayer insulation layer 11b which is formed of the silicon oxide film or the like is first formed on the lower light-blocking film 3c. A width of the concave portion 12 in the first interlayer insulation layer 11b is, for example, 0.25 μm. A depth of the concave portion 12 is, for example, 0.5 μm. A thickness of the concave portion 12 in the first interlayer insulation layer 11b is, for example, 0.35 μm.

Next, the semiconductor layer 30a which is formed of polysilicon or the like is formed on the first interlayer insulation layer 11b over the first surface 12a, the fourth surface 12d, the third surface 12c, the fifth surface 12e, and the second surface 12b in the first interlayer insulation layer 11b, by use of the film forming technology, the photography technology, and the etching technology of the related art. By forming the semiconductor layer 30a in the concave portion 12, it is possible to secure the gate length of 1.5 μm which is the same as in the related art, for example, and it is possible to form a planar width as narrow as 0.75 μm.

Figure 7D:
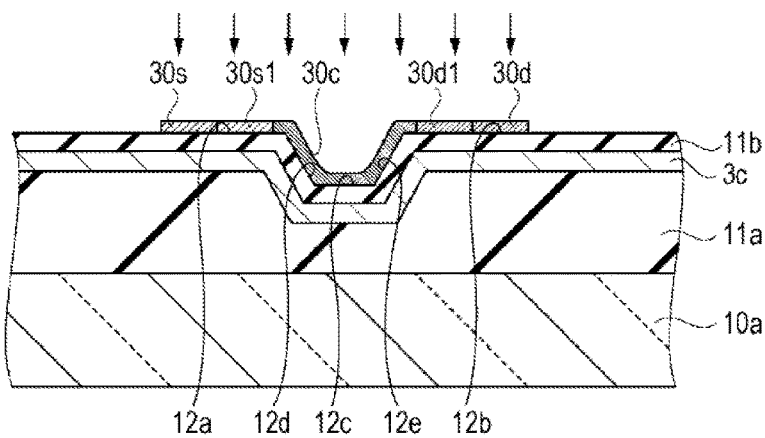

In a step (ion injection step) illustrated in FIG. 7D, impurity ions are inserted into the semiconductor layer 30a. Specifically, in a case where an N type TFT is formed, P type impurity ions such as boron (B) ions are doped in an area which is set as a channel area 30c. The N type impurity ions such as phosphorus (P) ions are doped by adjusting an amount of injection, in areas which are set as the source-drain area 30s on the data line side, the source-drain area 30d on the pixel electrode side, the LDD area 30s1 on the data line side, and the LDD area 30d1 on the pixel electrode side.

As a result, the source-drain area (source area) 30s on the data line side and the LDD area 30s1 on the data line side are arranged at a position corresponding to the first surface 12a in the first interlayer insulation layer 11b, and also, the source-drain area (drain area) 30d on the pixel electrode side and the LDD area 30d1 on the pixel electrode side are arranged at a position corresponding to the second surface 12b in the first interlayer insulation layer 11b. Further, the channel area 30c are arranged at a position corresponding to the third surface 12c, the fourth surface 12d, and the fifth surface 12e.

Figure 8A:
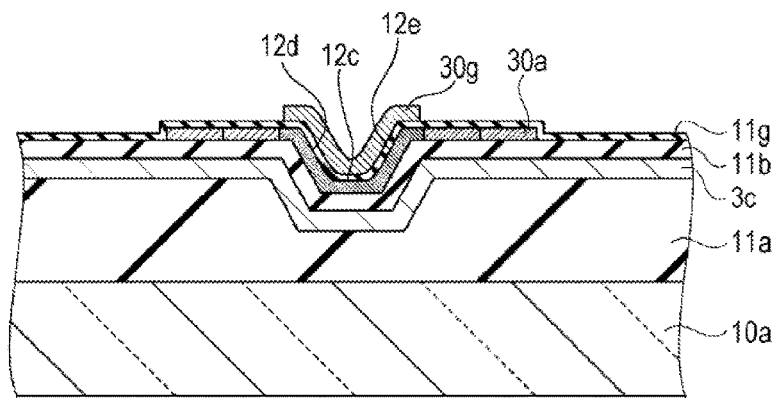
FIGS. 8A to 8C are schematic cross-sectional views illustrating a method of manufacturing a semiconductor device in a method of manufacturing a liquid crystal device.

In a step (gate insulation layer forming step and gate electrode forming step) illustrated in FIG. 8A, the gate electrode 30g is formed. Specifically, the gate insulation layer 11g is first formed on the semiconductor layer 30a and the first interlayer insulation layer 11b. Next, by forming a polysilicon film on the gate insulation layer 11g and then patterning the polysilicon film, the gate electrode 30g is formed at a position corresponding to at least the third surface 12c, the fourth surface 12d, and the fifth surface 12e, on the gate insulation layer 11g.

Figure 8B:
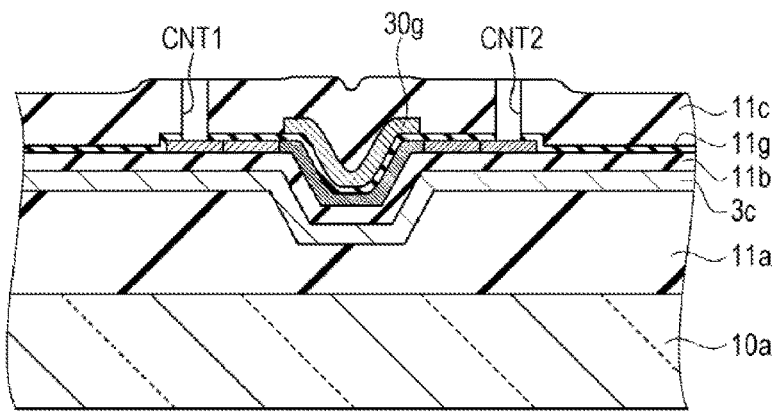

In a step illustrated in FIG. 8B, the second interlayer insulation layer 11c which is formed of the silicon oxide film or the like is formed on the gate electrode 30g and the gate insulation layer 11g. Next, the contact holes CNT1 and CNT2 are formed in the second interlayer insulation layer 11c and the gate insulation layer 11g, by use of the photolithography technology and the etching technology.

Figure 8C:
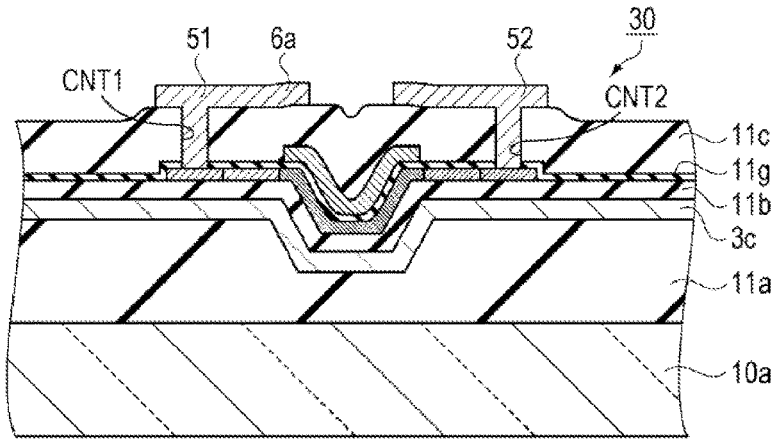

In a step illustrated in FIG. 8C, the data line 6a and the relay electrodes 51 and 52 are formed on the second interlayer insulation layer 11c. Specifically, the contact holes CNT1 and CNT2 are filled, the conduction member with the light-blocking property, such as the aluminum or the like is formed on the second interlayer insulation layer 11c, and the conduction member is patterned. As a result, the relay electrode 51 and the data line 6a which are electrically connected to the contact hole CNT1, and the relay electrode 52 which is electrically connected to the contact hole CNT2 are formed on the second interlayer insulation layer 11c. In this manner, the TFT 30 is formed.

Subsequently, description thereof will be made with reference to FIG. 6. In step S12, the pixel electrode 27 is formed. Specifically, the second interlayer insulation layer 11c, the third interlayer insulation layer 11d, the storage capacitor 16, and the fourth interlayer insulation layer 11e are formed on the TFT 30, by use of the film forming technology of the related art, such as the photolithography technology and the etching technology, and the pixel electrode 27 is formed on the fourth interlayer insulation layer 11e.

In step S13, the alignment film 28 is formed. Specifically, the inorganic materials such as the silicon oxide is obliquely deposited on an entire surface of the fourth interlayer insulation layer 11e in which the pixel electrode 27 is formed, and thereby the alignment film 28 with a columnar structure is formed.

Next, a method of manufacturing the opposing substrate 20 side will be described. In step S21, the opposing electrode 31 is first formed on the second base member 20a which is formed of light-transmitting materials such as the quartz substrate, by use of the film forming technology of the related art.

In step S22, the alignment film 32 is formed on the opposing electrode 31. An oblique deposition method of obliquely depositing the inorganic materials such as silicon oxide ($SiO_2$) is used as a method of manufacturing the alignment film 32. In this manner, the opposing substrate 20 is completed. Next, a method of bonding together the element substrate 10 and the opposing substrate 20 will be described.

In step S31, the seal material 14 is coated on the element substrate 10. Specifically, for example, by changing a relative positional relationship between the element substrate 10 and a dispenser (can also be used in an ejecting apparatus), the seal material 14 is coated on the periphery (so as to surround the display area E) of the display area E in the element substrate 10.

In step S32, the element substrate 10 and the opposing substrate 20 are bonded together. Specifically, the element substrate 10 and the opposing substrate 20 are bonded together via the coated seal material 14 in the element substrate 10.

Figure 9:
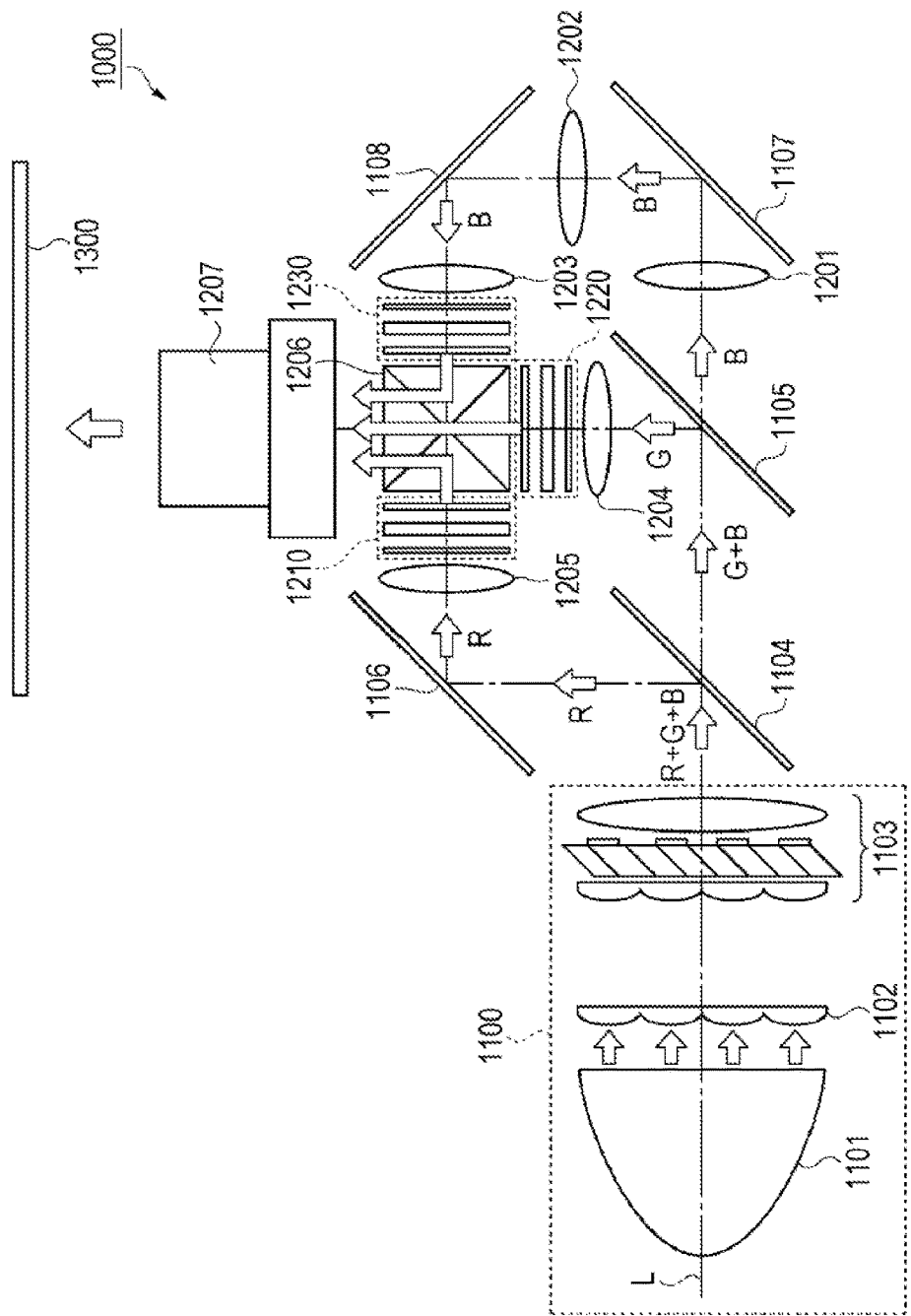
FIG. 9 is a schematic view illustrating a configuration of a projection type display device including a liquid crystal device.

In step S33, the liquid crystal is injected inside the structure from a liquid crystal inlet, and thereafter, the liquid crystal inlet is sealed with sealing materials. As a result, the liquid crystal device 100 is completed. Configuration of Electronic Apparatus Next, a projection type display device used as the electronic apparatus according to the present embodiment will be described with reference to FIG. 9. FIG. 9 is a schematic view illustrating a configuration of a projection type display device including the above-described liquid crystal device.

As illustrated in FIG. 9, the projection type display device 1000 according to the present embodiment includes a polarizing illumination device 1100 arranged along a system light axis L, two dichroic mirrors 1104 and 1105 used as light separation elements, three reflection mirrors 1106, 1107, and 1108, five relay lenses 1201, 1202, 1203, 1204, and 1205, transmission type liquid crystal light valves 1210, 1220, and 1230 used as three light modulation units, a cross dichroic prism 1206 used as a photosynthesis element, and a projection lens 1207.

The polarizing illumination device 1100 is schematically configured with a lamp unit 1101 used as a light source configured by a white light source such as an ultrahigh pressure mercury lamp or a halogen lamp, an integrator lens 1102, and a polarizing conversion element 1103.

The dichroic mirror 1104 reflects red light (R), and transmits green light (G) and blue light (B), of a polarized light beam emitted from the polarizing illumination device 1100. The other dichroic mirror 1105 reflects the green light (G) transmitted through the dichroic mirror 1104, and transmits the blue light (B).

The red light (R) reflected by the dichroic mirror 1104 is reflected by the reflection mirror 1106, and thereafter, is incident via the relay lens 1205 on the liquid crystal light valve 1210. The green light (G) reflected by the dichroic mirror 1105 is incident via the relay lens 1204 on the liquid crystal light valve 1220. The blue light (B) transmitting through the dichroic mirror 1105 is incident via a light guide system configured with three relay lenses 1201, 1202, and 1203 and two reflection mirrors 1107 and 1108 on the liquid crystal light valve 1230.

The liquid crystal light valves 1210, 1220, and 1230 are arranged so as to be respectively opposed to incident surfaces for each color light of the cross dichroic prism 1206. The color light which is incident on the liquid crystal light valves 1210, 1220, and 1230 is modulated based on image information (image signal) and is emitted towards the cross dichroic prism 1206.

In the prism, four rectangular prisms are bonded together, and a dielectric multilayer film for reflecting the red light and a dielectric multilayer film for reflecting the blue light are formed in a cross shape on internal surfaces thereof. The three color lights are synthesized by the dielectric multilayer films, and thereby light for displaying color images is synthesized. The synthesized light is projected onto a screen 1300 by the projection lens 1207 which is a projection optical system, and the image is enlarged and displayed.

The above-described liquid crystal device 100 is applied to the liquid crystal light valve 1210. The liquid crystal device 100 is arranged at a gap between a pair of polarizing elements arranged in a cross nicol shape on the incident side and exit side of the color light. The other liquid crystal light valves 1220 and 1230 are the same as the liquid crystal light valve 1210.

According to such a projection type display device 1000, the liquid crystal light valves 1210, 1220, and 1230 are used, and thereby it is possible to obtain a high reliability.

In addition, an electronic apparatus on which the liquid crystal device 100 is mounted can be used for various electronic apparatuses, such as a head-up display, a smartphone, an electronic view finder (EVF), a mobile mini projector, a cellular phone, a mobile computer, a digital camera, a digital video camera, a display, an in-vehicle apparatus, an audio apparatus, and an exposure device or an illumination apparatus, in addition to the projection type display device 1000.

As described above, according to the TFT 30, the liquid crystal device 100, the method of manufacturing the TFT 30, the method of manufacturing the liquid crystal device 100, and the electronic apparatus in the present embodiment, the following effects are obtained.

(1) According to the TFT 30, the liquid crystal device 100, the method of manufacturing the TFT 30, and the method of manufacturing the liquid crystal device 100 in the present embodiment, the concave portion 12 configured by the third surface 12*c*, the fourth surface 12*d*, and the fifth surface 12*e* in the lower insulation layer 11*a* is provided. Also, the semiconductor layer 30*a*, the gate insulation layer 11*g*, and the gate electrode 30*g* are formed along at least the third surface 12*c*, the fourth surface 12*d*, and the fifth surface 12*e* in the concave portion 12. Thus, it is possible to decrease the width of the gate electrode 30*g*, as viewed from a direction towards the back surface 12*f* from the first surface 12*a* and the second surface 12*b* (in a plan view), without reducing the gate length. As a result, it is possible to decrease the light-blocking area of the TFT 30, and to improve the aperture ratio. In addition, it is possible to inject ions into the semiconductor layer 30*a* by use of the manufacturing method of the related art, and to relatively simply form the TFT 30.

(2) According to the TFT 30, the liquid crystal device 100, the method of manufacturing the TFT 30, and the method of manufacturing the liquid crystal device 100 in the present embodiment, the lower light-blocking film 3*c* is formed according to the contours of the concave portion 12 in the lower insulation layer 11*a*. Thus, it is possible for the lower light-blocking film 3*c* and the semiconductor layer 30*a* to become close, and for the TFT 30 to function as a transistor with double gate electrodes by the gate electrode 30*g* and the lower light-blocking film 3*c* (back gate). As a result, it is possible to improve ON and OFF characteristics of the TFT 30.

(3) According to the electronic apparatus of the present embodiment, the above-described liquid crystal device 100 is included, and thereby it is possible to provide an electronic apparatus with a high display quality.

In addition, an aspect of the invention is not limited to the above-described embodiments, can be suitably modified within a range which is not contrary to gist or spirit of the invention which is read from the claims and the entire specification, and is included in the technical range of the aspect of the invention. In addition, it is also possible to implement the invention in the following forms.

Modification Example 1

As described above, the invention is not limited to the concave portion 12 to be formed in the lower insulation layer 11*a*. The concave portion may be formed before the semiconductor layer 30*a* is formed, and the concave portion 12 (eleventh surface 12*a*, twelfth surface 12*b*, thirteenth surface 12*c*, fourteenth surface 12*d* and fifteenth surface 12*e*) may be formed in, for example, the first base member 10*a*. In this case, the lower insulation layer 11*a* may be not formed.

Modification Example 2

As described above, the invention is not limited to being applied to the liquid crystal device 100 used as an electro-optical device, and may be applied to an organic EL device, a plasma display, electronic paper, or the like.

What is claimed is:

1. A semiconductor device comprising:
    a semiconductor layer which includes a source region, a drain region, and a channel region and is disposed above a first insulation layer;
    a gate insulation layer which covers the channel region; and
    a gate electrode which is disposed so as to be opposed to the channel region via the gate insulation layer,
    wherein the channel region of the semiconductor layer is formed into a concave shape.

2. The semiconductor device according to claim 1, wherein the source region and the drain region are formed into a flat shape.

3. The semiconductor device according to claim 2, wherein:
    the semiconductor layer includes a first LDD region between the channel region and the source region and a second LDD region between the channel region and the drain region, and
    the first LDD region and the second LDD region are formed into a flat shape.

4. An electro-optical device comprising:
    a semiconductor device comprising:
        a semiconductor layer which includes a source region, a drain region, and a channel region and is disposed above a first insulation layer, the channel region of the semiconductor layer is formed into a concave shape;
        a gate insulation layer which covers the channel region of the semiconductor layer;
        a gate electrode which is disposed so as to be opposed to the channel region via the gate insulation layer;
        a first electrode which is one of a source electrode and a drain electrode; and
        a second electrode which is the other of the source electrode and the drain electrode,
    a base;
    a scan line; and
    a data line which is arranged so as to intersect the scan line,
    wherein the semiconductor device is electrically connected to the scan line and the data line, and the scan line is arranged between the base and the semiconductor device.

5. The electro-optical device according to claim 4, wherein the source region and the drain region are formed into a flat shape.

6. The electro-optical device according to claim 5, wherein the semiconductor layer includes a first LDD region between the channel region and the source region and a second LDD region between the channel region and the drain region, and the first LDD region and the second LDD region are formed into a flat shape.

7. An electronic apparatus comprising the electro-optical device according to claim 4.

8. An electro-optical device comprising:
   an element substrate which includes a semiconductor device and a pixel electrode electrically connected to the semiconductor device, the semiconductor device comprising:
      a semiconductor layer which includes a source region, a drain region, and a channel region and is disposed above a first insulation layer, the channel region of the semiconductor layer is formed into a concave shape;
      a gate insulation layer which covers the channel region of the semiconductor layer; and
      a gate electrode which is disposed so as to be opposed to the channel region via the gate insulation layer;
   an opposing substrate which is opposed to the element substrate; and
   an electro-optical layer which is interposed between the element substrate and the opposing substrate.

9. The electro-optical device according to claim 8, wherein the source region and the drain region are formed into a flat shape.

10. The electro-optical device according to claim 9, wherein the semiconductor layer includes a first LDD region between the channel region and the source region and a second LDD region between the channel region and the drain region, and the first LDD region and the second LDD region are formed into a flat shape.

11. An electronic apparatus comprising the electro-optical device according to claim 8.

* * * * *